(12) United States Patent
Lee et al.

(10) Patent No.: US 8,916,778 B2
(45) Date of Patent: Dec. 23, 2014

(54) LIGHT EMITTING DEVICE ARRAY AND LIGHT SYSTEM

(75) Inventors: Sangwoo Lee, Seoul (KR); Jiun Kong, Seoul (KR); Il Seo, Seoul (KR); Hongboem Jin, Seoul (KR); Dongwook Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 323 days.

(21) Appl. No.: 13/367,988

(22) Filed: Feb. 7, 2012

(65) Prior Publication Data

US 2013/0039078 A1    Feb. 14, 2013

(30) Foreign Application Priority Data

Aug. 11, 2011    (KR) .................. 10-2011-0080268

(51) Int. Cl.
  *H05K 1/00*    (2006.01)
  *H05K 1/05*    (2006.01)
(52) U.S. Cl.
  CPC ..................................... *H05K 1/053* (2013.01)
  USPC ............................. 174/252; 174/255; 174/257
(58) Field of Classification Search
  CPC ... H05K 1/053; H05K 3/0061; H05K 3/0058; H05K 3/28; H05K 3/301; H05K 2201/10106; H01L 33/641
  USPC .......... 174/250, 255–258, 260, 252; 361/760, 361/783, 805–807
  See application file for complete search history.

(56) References Cited

U.S. PATENT DOCUMENTS

| | | | |
|---|---|---|---|
| 4,495,378 A * | 1/1985 | Dotzer et al. ................. | 174/252 |
| 8,446,082 B2 * | 5/2013 | Sanpei et al. ................. | 313/113 |
| 2007/0259159 A1 * | 11/2007 | Yeh et al. ...................... | 428/209 |
| 2007/0290307 A1 * | 12/2007 | Lin ................................ | 257/678 |
| 2007/0298543 A1 * | 12/2007 | Su et al. ........................ | 438/122 |
| 2008/0246143 A1 * | 10/2008 | Su et al. ........................ | 257/712 |
| 2009/0078455 A1 * | 3/2009 | Takakusaki et al. .......... | 174/260 |
| 2012/0201007 A1 * | 8/2012 | Yeh et al. ...................... | 361/719 |
| 2012/0273034 A1 * | 11/2012 | Sato et al. ..................... | 136/252 |
| 2013/0069099 A1 * | 3/2013 | Chen ............................. | 257/98 |

FOREIGN PATENT DOCUMENTS

WO    WO 99/20814 A1    4/1999

* cited by examiner

*Primary Examiner* — Hoa C Nguyen
(74) *Attorney, Agent, or Firm* — Birch, Stewart, Kolasch & Birch, LLP (57) ABSTRACT

Embodiments are about light emitting devices array. The light emitting device array according to embodiments may include a printed circuit board including a base layer, a first protection layer which is in contact with at least one surface of the base layer, an insulating layer disposed on the base layer, and a conduction layer disposed on the insulating layer and a light emitting device package mounted on the conduction layer, wherein the base layer includes iron (Fe).

4 Claims, 8 Drawing Sheets

LIGHT EMITTING DEVICE ARRAY AND LIGHT SYSTEM

CROSS-REFERENCE TO RELATED APPLICATION

This application claims the priority benefit of Korean Patent Application No. 10-2011-0080268, filed on Aug. 11, 2011, in the Korean Intellectual Property Office, the disclosure of which is incorporated herein by reference.

BACKGROUND

1. Field of the Invention

Embodiments relate to a light emitting device array. Specifically, it relates to a light emitting device to be thinner as a printed circuit used in the light emitting device array includes a base layer including iron.

2. Description of the Related Art

A light emitting diode converts electric signal into infrared light, visible light or form of a light by using of the characteristic of compound semiconductor. The light emitting devices is used in home appliances, a remote controller, an electronic display, an indicator, all kinds of automation equipments, etc. and application range of the light emitting device expands gradually.

A small light emitting diode (LED) has a surface mount device type, and thus, a LED lamp for a display device has surface mount device type. This surface mount device replaces conventional simple lighting lamps and it is used for a lighting indicator, a character indicator, and an image indicator.

Various appliances including the LED become thinner. Thus, when a printed circuit board where the LED is mounted is thick, it is difficult to be applied to the various appliances.

Therefore, the printed circuit board being thin and having a high heat radiation effect is required.

BRIEF DESCRIPTION OF THE DRAWINGS

Details of embodiments will be more clearly understood from the following detailed description taken in conjunction with the accompanying drawings, in which.

DETAILED DESCRIPTION OF EMBODIMENTS

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience in description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 1:
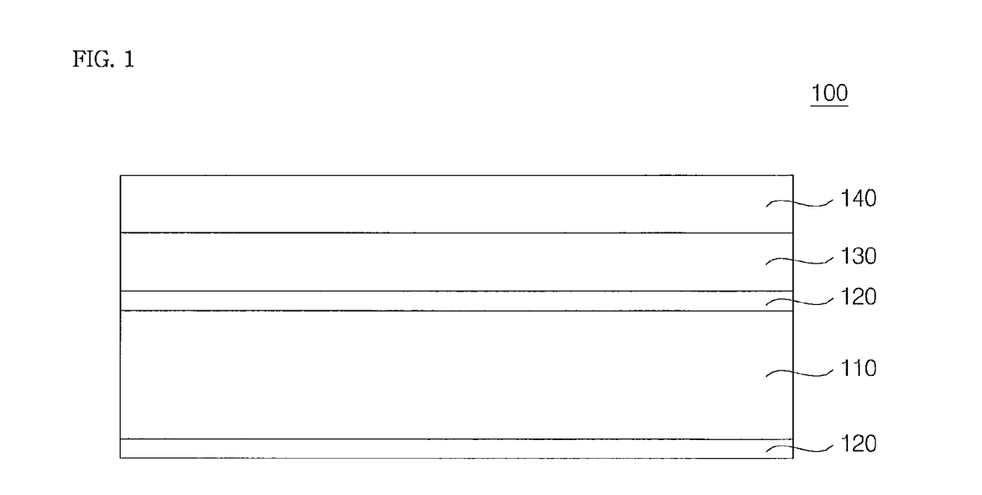
FIG. 1 is a cross-sectional view illustrating a printed circuit board according to an embodiment.

FIG. 1 is a cross-sectional view illustrating a printed circuit board according to an embodiment.

Referring to FIG. 1, a printed circuit board 100 may include a base layer 110, a first protection layer 120, an insulating layer 130, and a conduction layer 140.

The printed circuit board 100 may be a single-sided printed circuit board, a double-sided printed circuit board or a multi-layered printed circuit board. In the embodiment, the printed circuit board 100 is the single-sided printed circuit board, but it is not limited thereto.

The base layer 110 may include iron (Fe), and may include alloy having iron (Fe). Also, an amount of the iron may be 50% or more based on the base layer 110.

The iron has strength larger than other metals. Thus, the base layer 110 is thin, a bending of the base layer 110 may be prevented. According, the base layer 110 can be thin.

When the base layer 110 is thin, the printed circuit board 100 may be thinner and the printed circuit board has a high heat conduction, thus, it may have a high heat radiation.

Also, the cost of the iron is lower than that of aluminium which is used for a material of conventional base layer 110, manufacturing costs of the printed circuit board 100 may be low.

The first protection layer 120 may be in contact with at least one surface of the base layer 110, and it may be in contact with at least one of an upper surface and a bottom surface of the base layer 110.

When the iron included in the base layer 110 is exposed to the outside, it is corroded by outer oxygen and moisture. When the base layer 110 is corroded, the heat conduction and the heat radiation of the base layer 110 may be low. Therefore, as the first protection layer 120 prevents the base layer 110 from being exposed to the outside and includes a metal having a high reactivity, the first protection layer 120 may prevent the base layer 110 from being corroded.

The first protection layer 120 may include at least one of aluminium (Al), silicon (si), and zinc (Zn), and combination thereof. Also, the first protection layer 120 may include multi-layers, but it is not limited thereto.

Since the first protection layer 120 includes a material having a high heat conductivity, the printed circuit board 100 may have a high heat radiation effect. Here, an amount of the aluminium may be 5% or more based on the first protection layer 120.

The insulating layer 130 may be disposed on the base layer 110.

The insulating layer 130 includes a resin, which is an insulating material. For example, the insulating layer 130 includes an epoxy resin, a phenol resin, an acrylic resin, a polycarbonate resin, a polyester resin, a melamine resin, a silicon resin, a polyimide resin, a fluoride resin, etc.

The conduction layer 140 may be disposed on the insulating layer 130.

The conduction layer 140 may include a conductive material such as copper (Cu).

Figure 2:
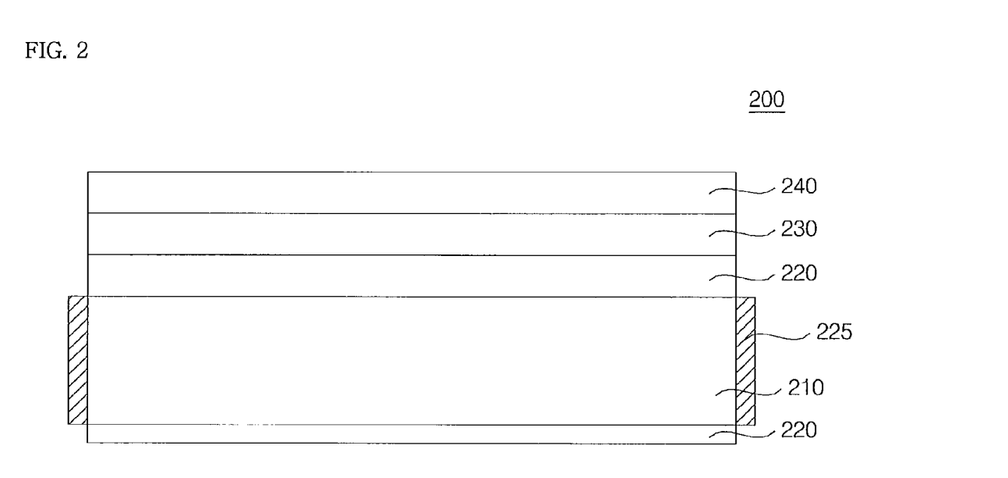
FIG. 2 is a cross-sectional view illustrating a printed circuit board according to an embodiment.

FIG. 2 is a cross-sectional view illustrating a printed circuit board according to an embodiment.

Referring to FIG. 2, a printed circuit board 200 may includes a base layer 210, a first protection layer 220, a second protection layer 225, an insulating layer 230, and a conduction layer 240.

The base layer 210, the first protection layer 220, the insulating layer 230, and the conduction layer 240 are the same as those in the embodiment of FIG. 1. Thus, the description will be omitted regarding them. Hereinafter, the second protection layer 225 will be described.

The second protection layer 225 may be disposed on at least one side surface of the base layer 210.

The second protection layer 225 may include an oxide film. The oxide film is formed by oxidization of a material included in the base layer 210 and outside oxygen.

In the case that the oxide film is formed on the side surface of the base layer 210, it prevents the base layer from oxidizing by outer oxygen.

Figure 3:
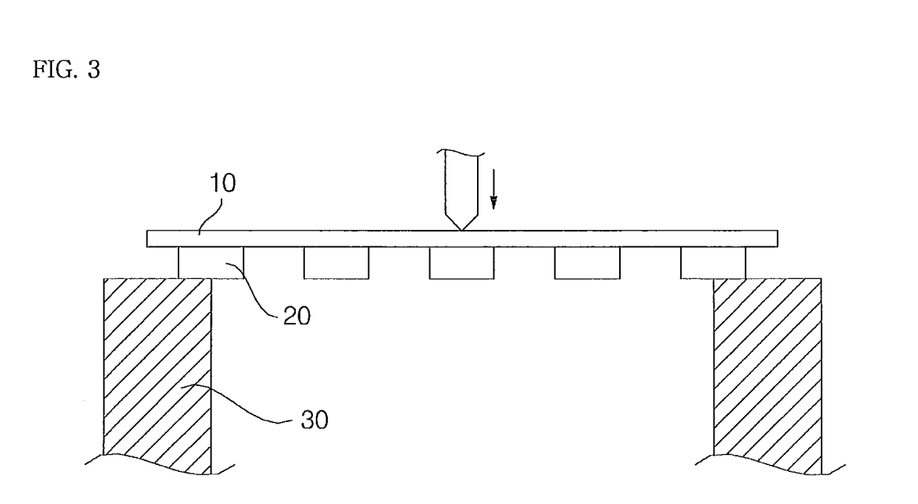
FIG. 3 is a view illustrating an experiment about bending force of a printed circuit board according to an embodiment.

FIG. 3 is a view illustrating an experiment about a bending force of a printed circuit board according to an embodiment.

Referring to FIG. 3, a LED 20 mounted on the printed circuit board 10 is fixed on both side jigs to measure the bending force of the printed circuit board 10. When a center of the printed circuit board is forced, a peak force is measured at moment that the LED disposed on the center is apart from the printed circuit board.

Using above method, bending forces of the aluminium board based on aluminium, the iron board based on iron according to the embodiment, and the FR4 board were measured, and a measurement result is shown in Table 1.

TABLE 1

|  | PCB Type | | | | |
| --- | --- | --- | --- | --- | --- |
|  | Al 50 (0.6T) | Al 50 (0.8T) | Al 50 (1.0T) | Fe (0.65T) | FR4 (0.65T) |
| Min [kg · f] | 1.35 | 3.32 | 3.32 | 2.47 | 1.47 |
| Max [kg · f] | 1.52 | 3.37 | 3.37 | 3.11 | 2.73 |
| Avg [kg · f] | 1.43 | 2.37 | 3.34 | 2.68 | 1.97 |

Referring to Table 1, comparing the aluminium board and the iron board according to the embodiment, the bending force of the iron board having a 0.65T thickness is smaller than that of the aluminum board having a 0.65T thickness. However, when the thickness of the aluminum board is same as that of the iron board, as the iron board has a higher strength than the aluminium board, the bending force of the iron board is larger than that of the aluminium board.

Also, comparing the iron board and the FR4 board, the bending force of the iron board is larger than that of the FR4 board by 36%.

Therefore, the iron board has a higher physical durability than the conventional used FR4 board.

TABLE 2

|  | PCB Type | | |
| --- | --- | --- | --- |
|  | FR4 (0.65T) | Al 50 (1.0T) | Fe (0.65T) |
| ΔT (Ta = 25° C.) | 34.5° C. | 31.6° C. | 21.6° C. |
| ΔT (Ta = 60° C.) | 25.9° C. | 20.2° C. | 12.9° C. |
| ΔT (Ta = 90° C.) | 8.9° C. | 7.8° C. | 6.5° C. |

Table 2 shows an experimental result about the heat radiation of the printed circuit board.

In Table 2, Ta is a surrounding temperature and ΔT is a difference between the surrounding temperature and a temperature of the printed circuit board.

As ΔT is smaller, the heat radiation property of the printed circuit board is high. This is, the fact that ΔT is small shows that an increasing amount of the printed circuit board is small.

Referring to Table 2, among the FR4 board, the aluminium board and the iron board, the iron board has a smallest ΔT. Thus, the iron board has a highest heat radiation property. This is, the iron has a lower heat conductivity than the aluminium, but the iron board may be thinner than the aluminium board. Thus, a thermal path can be short and a thermal resistance can be small. Also, as the first protection layer is disposed on the base layer and the first protection layer includes a material having a high heat conductivity such as the aluminium, the heat conduction of horizontal direction in the printed circuit board may be high.

Therefore, by the above experiments, it can be seen that the iron board based on iron according to the embodiment has a high physical durability and heat radiation property compare with the aluminium board and the FR4 board.

Figure 4:
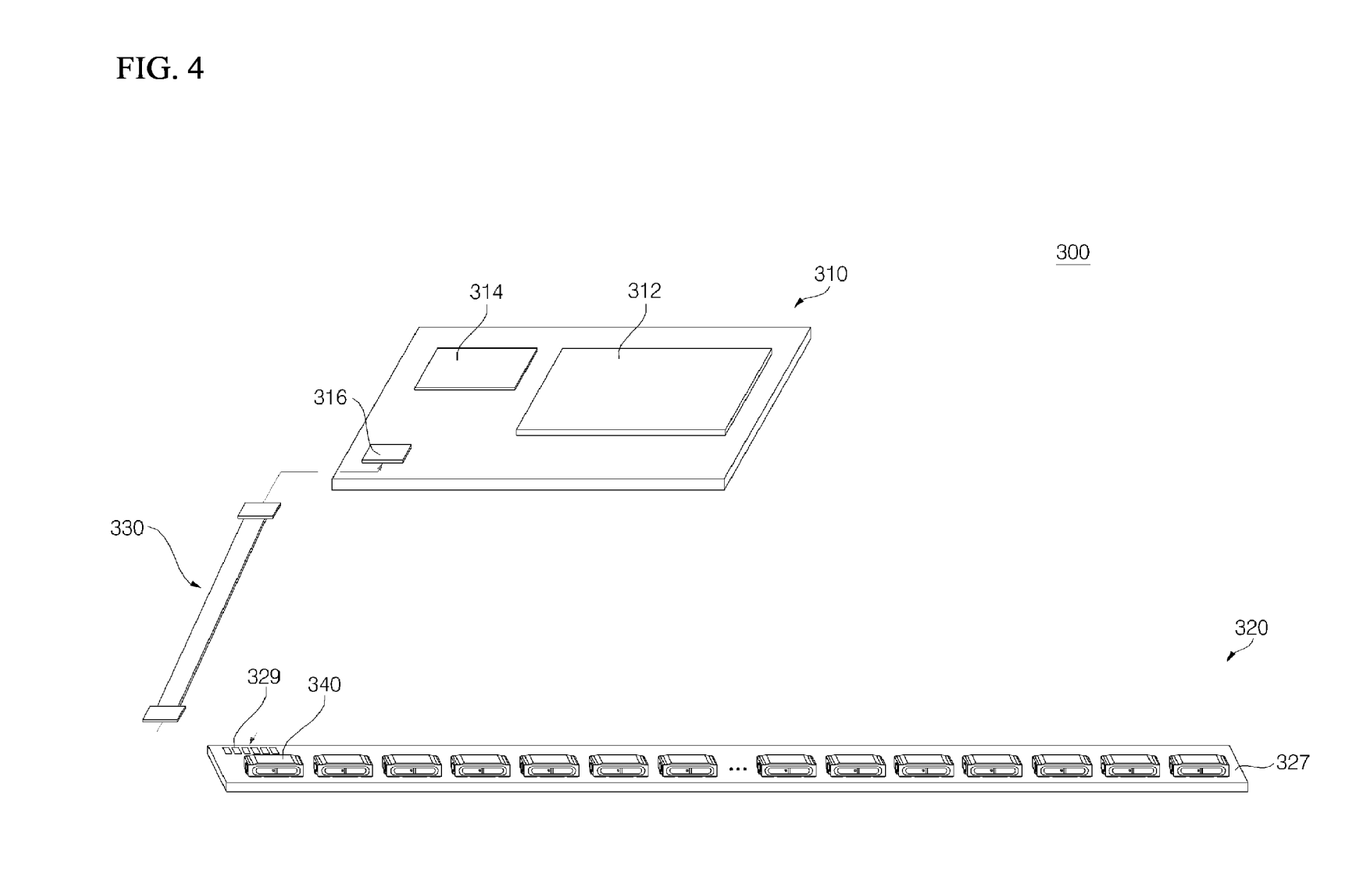
FIG. 4 is an exploded perspective view illustrating a light emitting device module including a light emitting device array according to an embodiment.

FIG. 4 is an exploded perspective view illustrating a light emitting device module including a light emitting device array according to an embodiment.

Referring to FIG. 4, a light emitting device module 300 may include a power control module 310, a light emitting device module 320, and a connector 330.

The power control module 310 illustrated in FIG. 4 may be a supply apparatus for supplying the power from an outside power.

Herein, the power control module 310 may include a power supply 312, a control unit 314 which control the power supply 312, and the connector contacting unit 316 contacted to a first side of the connector 330.

Here, the power supply 312 operates by the control of the control unit 314 and produces the power to supply to a light emitting device package 340 mounted on the light emitting device array 320.

The control unit 314 may control the operation of the power supply 312 by input-command from the outside.

Here, the input-command may be an output-command from an input apparatus connected directly or indirectly with the light emitting device module 300. However, it is not limited thereto.

Also, the connector contacting unit 316 may be connected to the first side of the connector 330, and the power from the power supply 312 supplies to the connector 330.

The light emitting device array 320 may include the light emitting device package 325, a board 327 where the light emitting device package 340 mounted, and a connector terminal 329 disposed on the board 327 and connected with a second side of the connector 330.

The connector terminal 329 may electrically connected to the connector contacting part 316 through connector 330.

The board 327 may be the printed circuit board 100 or 200 illustrated in FIG. 1 or FIG. 2.

A plurality of the light emitting device packages 340 may be divided into several groups (not shown) and are connected to each other in series.

The number of the light emitting device packages 340 included in the several groups is not limited.

At least two of the light emitting device packages 340 having colors different from each other may be mounted alternately with each other. And, the light emitting device packages 340 may be mounted with group according to a size of the light emitting device package 340. Also, the light emitting device packages 340 may have one color. Thus, it is not limited thereto.

For example, when the light emitting device array 320 emits an white light, the light emitting device packages 340 may include the light emitting device packages emitting a red light, a blue light, and green light. Therefore, the light emitting device packages emitting the red light, the blue light, and green light may be mounted alternately with each other.

Each of the light emitting device packages 340 will be described with reference to FIG. 5.

Figure 5:
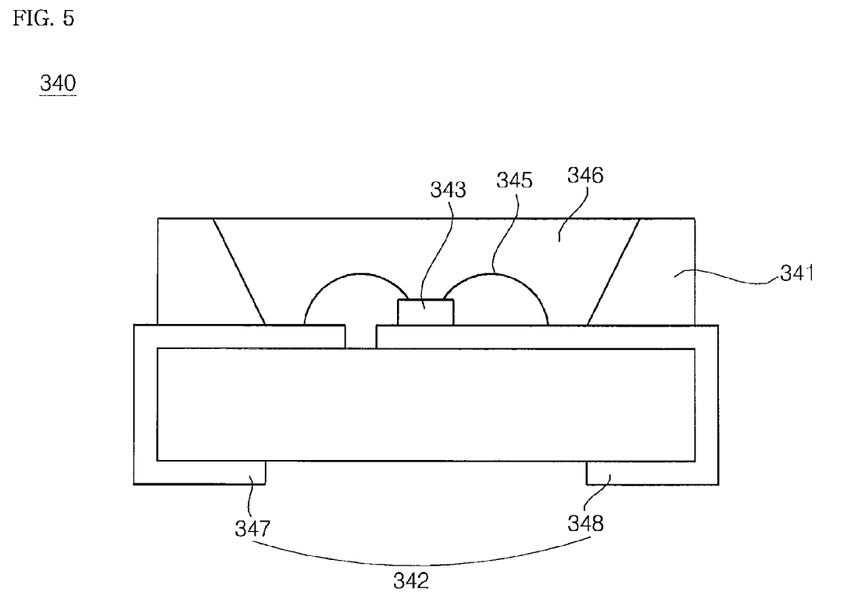
FIG. 5 is a cross-sectional view illustrating a light emitting device package included in the light emitting device module of FIG. 4.

FIG. 5 is a cross-sectional view illustrating a light emitting device package included in the light emitting device module of FIG. 4.

Referring to FIG. 5, the light emitting device packages 340 may include a body 341 having cavity (C), a lead frame 342, a light emitting device 343, an wire 345, and a resin 346.

The body 341 may function as a housing and include a first and second lead frames 347 and 348. The body 341 may include at least one of a resin material such as polyphthalamide (PPA), silicon (Si), aluminum (Al), aluminum nitride (AlN), photosensitive glass (PSG), polyamide 9T (PA9T), syndiotactic polystyrene (SPS), metal materials, sapphire ($Al_2O_3$), beryllium oxide (BeO), a printed circuit board (PCB). The body 341 may be formed by an injection molding process, an etching process or the like, but it is not limited thereto.

The body 341 may include the cavity, on which the light emitting device 343 is mounted. Also, the inner surface of the body 341 may be disposed with an inclined surface. The reflective angle of light emitted from the light emitting device 343 may be varied, depending on the angle of the inclined surface. Accordingly, the orientation angle of light emitted to the outside can be controlled.

By decreasing the light orientation angle, concentration of light emitted from the light emitting device 343 to the outside may be increased. On the contrary, if the light orientation angle is increased, concentration of light emitted from the light emitting device 343 to the outside may be decreased.

When viewing the cavity (C) in the body 341 from the top side, it may take various shapes including a circular shape, a rectangular shape, a polygonal shape, an elliptical shape, and a shape with curved corners. But, it is not limited thereto.

The inner and a bottom surfaces of the cavity (C) may include reflective coating film (not shown), and the reflective coating film may be formed to have a roughness and may include a material such as silver (Ag) and aluminium (Al).

The lead frame 342 may include a metal for example at least one of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe) or alloys of thereof. And the lead frame 342 may include a single layer or multiple layers, however it is not limited thereto.

The lead frame 342 may include a first lead frame 347 and a second lead frame 348 to supply power different from each other. Here, the light emitting device 343 may be disposed on the first lead frame 347, and the second lead frame 348 may be apart from the first lead frame 347.

The light emitting device 343 is a kind of semiconductor device which is disposed on the first lead frame 347 and emits light of a designated wavelength by power applied from the outside, and may be formed based on a group III-V compound, such as gallium nitride (GaN), aluminum nitride (AlN), indium nitride (InN), gallium arsenide (GaAs), etc. For example, the light emitting device 343 may be a light emitting diode.

The light emitting diode may be, for example, a colored light emitting device to emit red, green, blue and white light, or an ultraviolet (UV) light emitting device to emit ultraviolet light, but it is not limited thereto. One or more light emitting devices may be mounted.

Also, the light emitting device 343 may be applied to a horizontal type device having all electric terminals formed on the top surface thereof, a vertical type device having all electric terminals formed on the top or bottom surface thereof, or a flip-chip device.

The light emitting device 343 is electrically connected to the first and second lead frames 347 and 348 through a wire to be supplied an outside power. The horizontal type device may use wire bonding having two wire, and the vertical type device may use wire bonding having one wire.

The resin 346 may be fill the cavity (C) to seal the light emitting device 343 and the wire 345. The resin 346 may include transparent resin material such as a silicon, an epoxy and be formed by UV or thermal curing, after filling the cavity (C).

An upper surface shape of the resin 346 may be a concave lens shape, a convex lens shape, and a flat shape. According to the shape of the resin 346, the orientation angle of the light emitted from the light emitting device 343 may be varied.

Also, the resin having other lens shape may be disposed on the resin 346, but, it is not limited thereto.

The resin 346 may include a phosphor and types of the phosphor may be selected considering the wavelength of light emitted by the light emitting device 343, enabling the light emitting device package 340 to produce white light.

That is, the phosphor is excited by first light emitted from the light emitting device 343 to create second light. For example, when the light emitting device 343 is a blue light emitting diode (LED) and the phosphor is a yellow phosphor, the yellow phosphor is excited by blue light to emit yellow light, and blue light emitted from the blue LED and yellow light excited from the blue light are combined, the light-emitting device package 340 may emit white light.

Similarly, if the light emitting device 343 is a green LED, a magenta phosphor or a combination of blue and red phosphors may be employed. Alternatively, when the light emitting device 343 is a red LED, a cyan phosphor or a combination of blue and green phosphors may be employed.

Such phosphor may be any one commonly known in the art, such as YAG, TAG, sulfide, silicate, aluminate, nitride, carbide, nitride-silicate, borate, fluoride or a phosphate based material, etc.

Figure 6A:
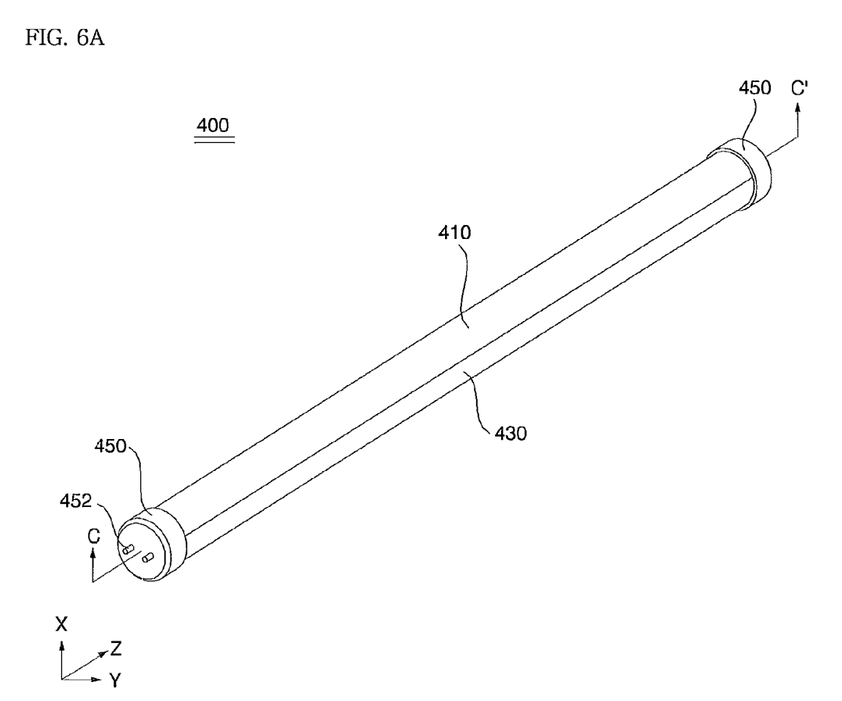
FIG. 6A is a perspective view illustrating a lighting apparatus including a printed circuit board according to an embodiment.
Figure 6B:
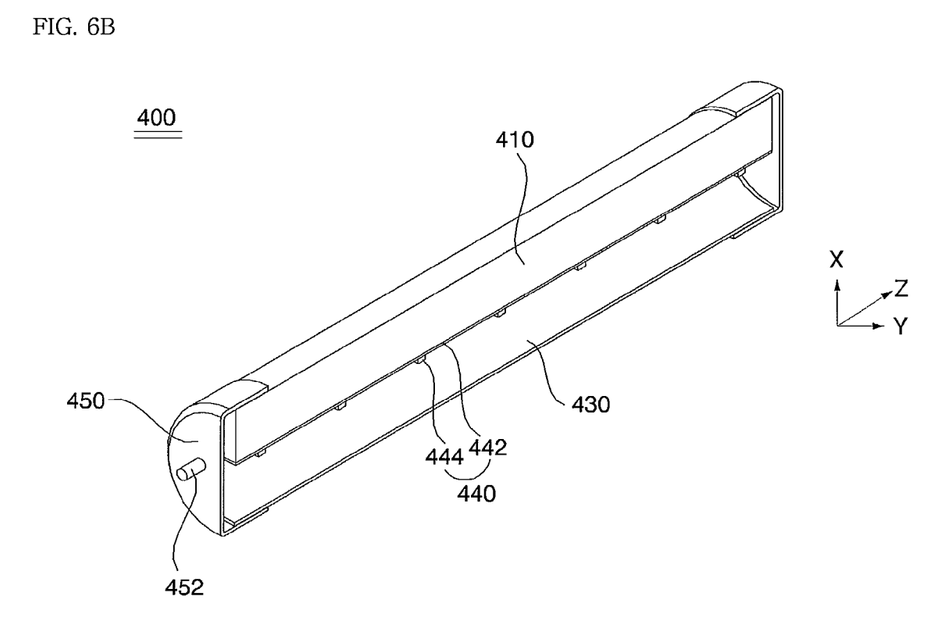
FIG. 6B is a cross-sectional view illustrating the lighting apparatus taken along a line C-C' in FIG. 6A.

FIG. 6A is a perspective view illustrating a lighting apparatus including a printed circuit board according to an embodiment, and FIG. 6B is a cross-sectional view illustrating the lighting apparatus taken along a line C-C' in FIG. 6A.

Hereinafter, for better understanding, the lighting device 400 will be described based on a longitudinal direction (Z), a horizontal direction (Y) vertical to the longitudinal direction (Z), and a height direction (X) vertical to the longitudinal direction (Z) and the horizontal direction (Y).

That is, FIG. 6B is a sectional view of the lighting device 400 of FIG. 6A, taken along the cross-section of the longitudinal direction (Z) and height direction (X) and seen from the horizontal direction (Y).

Figure 7:
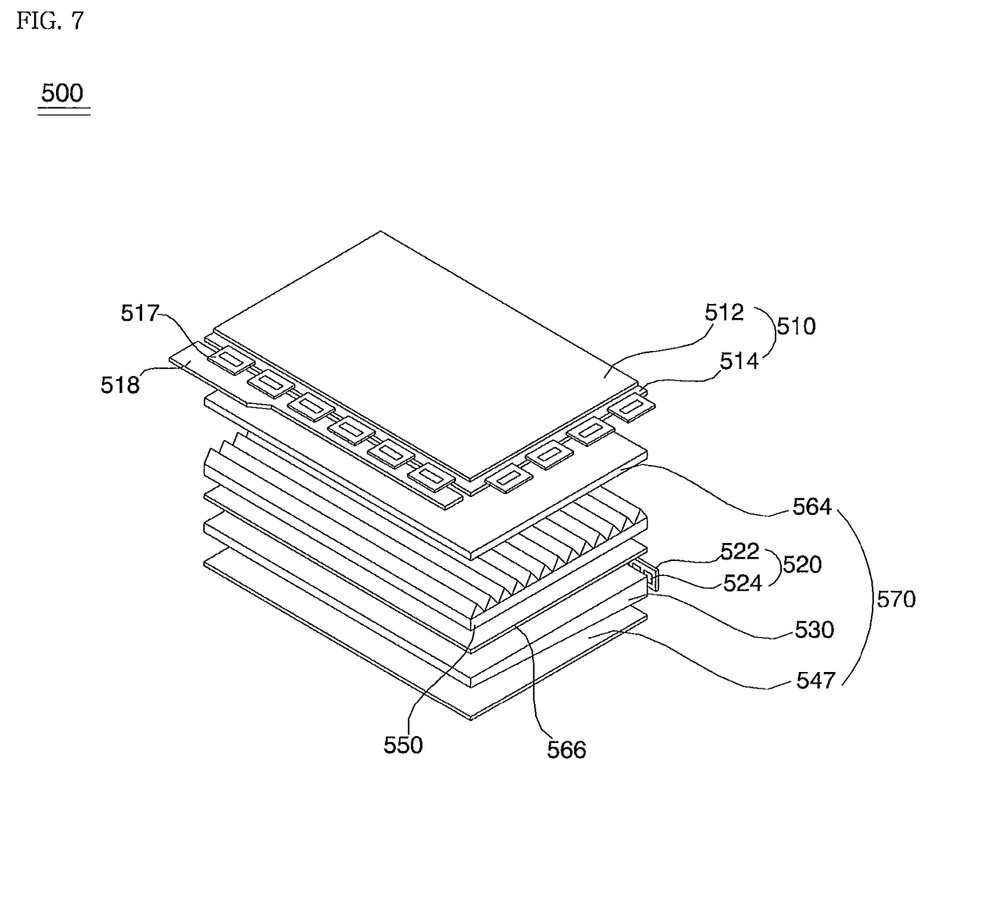
FIG. 7 is an exploded perspective view illustrating a liquid crystal display apparatus including a printed circuit board according to an embodiment.
Figure 8:
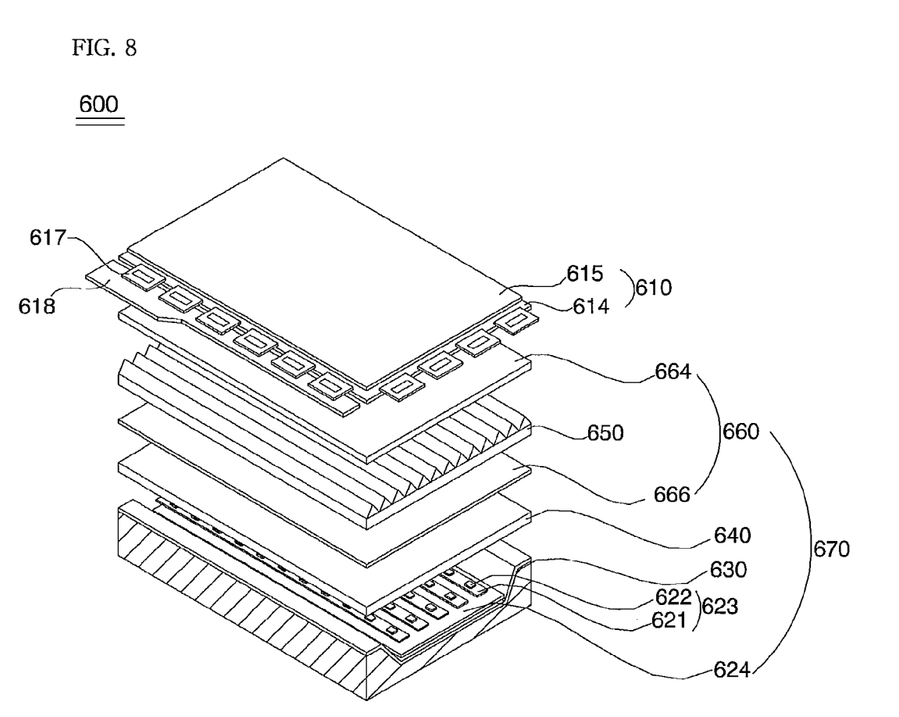
FIG. 8 is an exploded perspective view illustrating a liquid crystal display apparatus including a printed circuit board according to an embodiment.

Referring to FIGS. 7 and 8, the lighting device 400 may include a body 410, a cover 430 connected to the body 410 and an end cap 450 arranged at both ends of the body 410.

A light emitting device module 440 is connected to the bottom of the body 410 and the body 410 may be composed of a metal which exhibits superior conductivity and excellent heat release effects in order to discharge heat generated from light emitting device packages 444 to the outside through the top of the body 410.

The light emitting device packages 444 are mounted in multiple colors and multiple rows on the PCB 442 to form an array and may be spaced from one another by a predetermined distance or by different distances, as necessary, to control brightness. The PCB 442 may be the printed circuit board 100 or 200 illustrated in FIG. 1 or FIG. 2.

The cover 430 may take the shape of a circle to surround the bottom of the body 410, without being limited thereto.

The cover 430 protects the light emitting device module 440 from foreign substances. In addition, the cover 430 prevents glare generated from the light emitting device package 444 and includes diffusion particles to uniformly discharge light to the outside. In addition, a prism pattern or the like may be formed on at least one of the inner and outer surfaces of the cover 430. Alternatively, a phosphor may be applied to at least one of the inner and outer surfaces of the cover 430.

Meanwhile, the cover 430 should exhibit superior light transmittance, so that it can discharge light generated from the light emitting device package 444 through the cover 430 to the outside, and the cover 430 should exhibit sufficient heat resistance so that it can endure heat emitted by the light emitting device package 444. Preferably, the cover 430 is composed of a material including polyethylene terephthalate (PET), polycarbonate (PC), polymethyl methacrylate (PMMA) and the like.

The end cap 450 is arranged on both ends of the body 410 and may be used to seal a power device (not shown). In addition, the end cap 450 is provided with a power pin 452, allowing the lighting device 400 to be applied to a conventional terminal from which fluorescent light has been removed, without using any additional device.

FIG. 7 and FIG. 8 are an exploded perspective view illustrating a liquid crystal display apparatus including a printed circuit board according to embodiments.

FIG. 7 illustrates an edge-light type liquid crystal display device 500 which includes a liquid crystal display panel 510 and a backlight unit 570 to supply light to the liquid crystal display panel 510.

The liquid crystal display panel 510 displays an image using light supplied from the backlight unit 570. The liquid crystal display panel 510 includes a color filter substrate 512 and a thin film transistor substrate 514 which face each other such that a liquid crystal is interposed therebetween.

The color filter substrate 512 can realize color images to be displayed through the liquid crystal display panel 510.

The thin film transistor substrate 514 is electrically connected to a printed circuit board 518 on which a plurality of circuit parts are mounted through a drive film 517. The thin film transistor substrate 514 may apply drive voltage supplied from the printed circuit board 518 in response to a drive signal supplied from the printed circuit board 518.

The thin film transistor substrate 514 may include thin film transistors and pixel electrodes formed on a substrate formed of a transparent material, such as glass or plastic.

The backlight unit 570 includes a light emitting device module 520 outputting light, a light guide panel 530 to convert light supplied from the light emitting device module 520 into surface light and then to supply the surface light to the liquid crystal display panel 510, a plurality of films 550, 566 and 564 to uniformize bright distribution of light supplied from the light guide panel 530 and to improve vertical incident properties, and a reflective sheet 547 to reflect light emitted from the rear surface of the light guide panel 530 toward the light guide panel 530.

The light emitting device module 520 may include a plurality of light emitting device packages 524, and a PCB 522 on which the plural light emitting device packages 524 are mounted to form an array.

Particularly, the light emitting device package 524 includes a film provided with a plurality of holes on a light emitting surface thereof, and may thus omit a lens, thereby having a slim structure and improving light extraction efficiency. Therefore, a thinner backlight unit 570 may be implemented.

The plural films 550, 566 and 564 of the backlight unit 570 may include a diffusion film 566 to diffuse light incident from the light guide panel 530 toward the liquid crystal display panel 510, a prism film 550 to concentrate diffused light to improve vertical incident properties, and a protective film 564 to protect the prism film 550.

FIG. 8 is an exploded perspective view illustrating a backlight unit in accordance with another embodiment.

Here, a description of components of FIG. 8 which are substantially the same as those of FIG. 7 will be omitted.

FIG. 8 illustrates a direct type backlight unit 670, and a liquid crystal display apparatus 600 includes a liquid crystal display panel 610 and the backlight unit 670 to supply light to the liquid crystal display panel 610.

The liquid crystal display panel 610 is the same as the liquid crystal display panel 510 of FIG. 6, and a detailed description thereof will thus be omitted.

The backlight unit 670 may include a plurality of light emitting device modules 623, a reflective sheet 624, a bottom chassis 630 in which the light emitting device modules 623 and the reflective sheet 624 are received, a diffusion plate 640 disposed above the light emitting device modules 623, and a plurality of optical films 660.

The light emitting device module 623 may include a PCB 621 on which a plurality of light emitting device packages 622 is mounted to form an array.

Particularly, the light emitting device package 622 includes a film formed of a conductive material and provided with a plurality of holes on a light emitting surface thereof, and may thus omit a lens, thereby having a slim structure and improving light extraction efficiency. Therefore, a thinner backlight unit 670 may be implemented.

The reflective sheet 624 reflects light emitted from the light emitting device packages 622 toward the liquid crystal display panel 610, thus improving light efficiency.

Light emitted from the light emitting device modules 623 is incident upon the diffusion plate 640, and the optical films 660 are disposed above the diffusion plate 640. The optical films 660 include a diffusion film 666, a prism film 640 and a protective film 664.

In the light emitting device packages and the lighting systems including the lighting apparatus and the backlight unit in accordance with the embodiments, a light emitting device is mounted upright and is thus electrically connected to lead frames without wire bonding. Therefore, lowering of brightness of light emitted from the light emitting device package due to wires may be prevented, production costs according to wire bonding may be reduced, and process steps may be simplified. Further, lighting in a different direction from the conventional light emitting device package may be enabled.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A printed circuit board comprising:
    a base layer;
    a first protection layer which is in contact with at least one surface of the base layer;
    an insulating layer disposed on the base layer; and
    a conduction layer disposed on the insulating layer,
    wherein the base layer includes iron (Fe),
    wherein the first protection layer includes at least one of aluminum (Al), silicon (Si), and zinc (Zn), and
    wherein the base layer has a smaller thermal resistance than the first protection layer;
    a second protection layer which is in contact with at least one side surface of the base layer, wherein the second protection layer includes an oxide film formed by oxidation of the base layer.

2. The printed circuit board according to claim 1, wherein the first protection layer is in contact with at least one of an upper surface and a bottom surface of the base layer.

3. The printed circuit board according to claim 1, wherein an amount of the aluminum is 5% or more based on the first protection layer.

4. The printed circuit board according to claim 1, wherein an amount of the iron is 50% or more based on the base layer.

* * * * *